United States Patent [19]

Betzl et al.

[11] 4,266,205

[45] May 5, 1981

[54] RESONATOR FORMED IN INTEGRATED MOS TECHNOLOGY UTILIZING SWITCHED CAPACITORS

[75] Inventors: Hermann Betzl; Ernst Hebenstreit, both of Munich; Roland Schreiber, Ottobrunn-Riemerling, all of Fed. Rep. of Germany

[73] Assignee: Siemens Aktiengesellschaft, Berlin & Munich, Fed. Rep. of Germany

[21] Appl. No.: 51,701

[22] Filed: Jun. 25, 1979

[30] Foreign Application Priority Data

Jun. 30, 1978 [DE] Fed. Rep. of Germany ....... 2828840

[51] Int. Cl.³ ..................... H03H 17/06; H03H 17/04
[52] U.S. Cl. ..................................... 333/165; 333/166
[58] Field of Search ............................. 333/165, 166; 307/221 D; 357/24; 328/167

[56] References Cited

PUBLICATIONS

Fried, Analog Sample Data Filters, IEEE Journal of Solid State Circuits, pp. 302–304, 8–72.

*Primary Examiner*—Eli Lieberman
*Attorney, Agent, or Firm*—Hill, Van Santen, Steadman, Chiara & Simpson

[57] ABSTRACT

A resonator circuit formed in MOS technology for scanned analog signals, wherein such circuits are constructed for use with accumulators and information processing is accomplished by means of switched capacitors which are charged or respectively connected to each other by way of clock pulse transistors. In the present invention, the realization of general ladder networks or branching circuits for builders in single layer MOS techniques is accomplished by utilizing a second continuous branch which is switched to a first accumulator stage by clock pulse switches and is connected with a reference potential through a capacitor as well as to a further accumulator input through a series switch. The signal series arms are connected with the outputs of the total accumulator arrangement by way of time delay transit elements. The total accumulator arrangement is expanded to a resonator of the type of a four pole network having two inputs to which one respective transmission and one respective reflection output is assigned by utilizing difference elements and transfer elements. The arrangement of the invention is suitable for use as general branching filter circuits, and an increase of the dynamic range by better suppression of the clock pulse pickup and the harmonic distortion of the second order occurs by utilizing push-pull arrangements.

6 Claims, 5 Drawing Figures

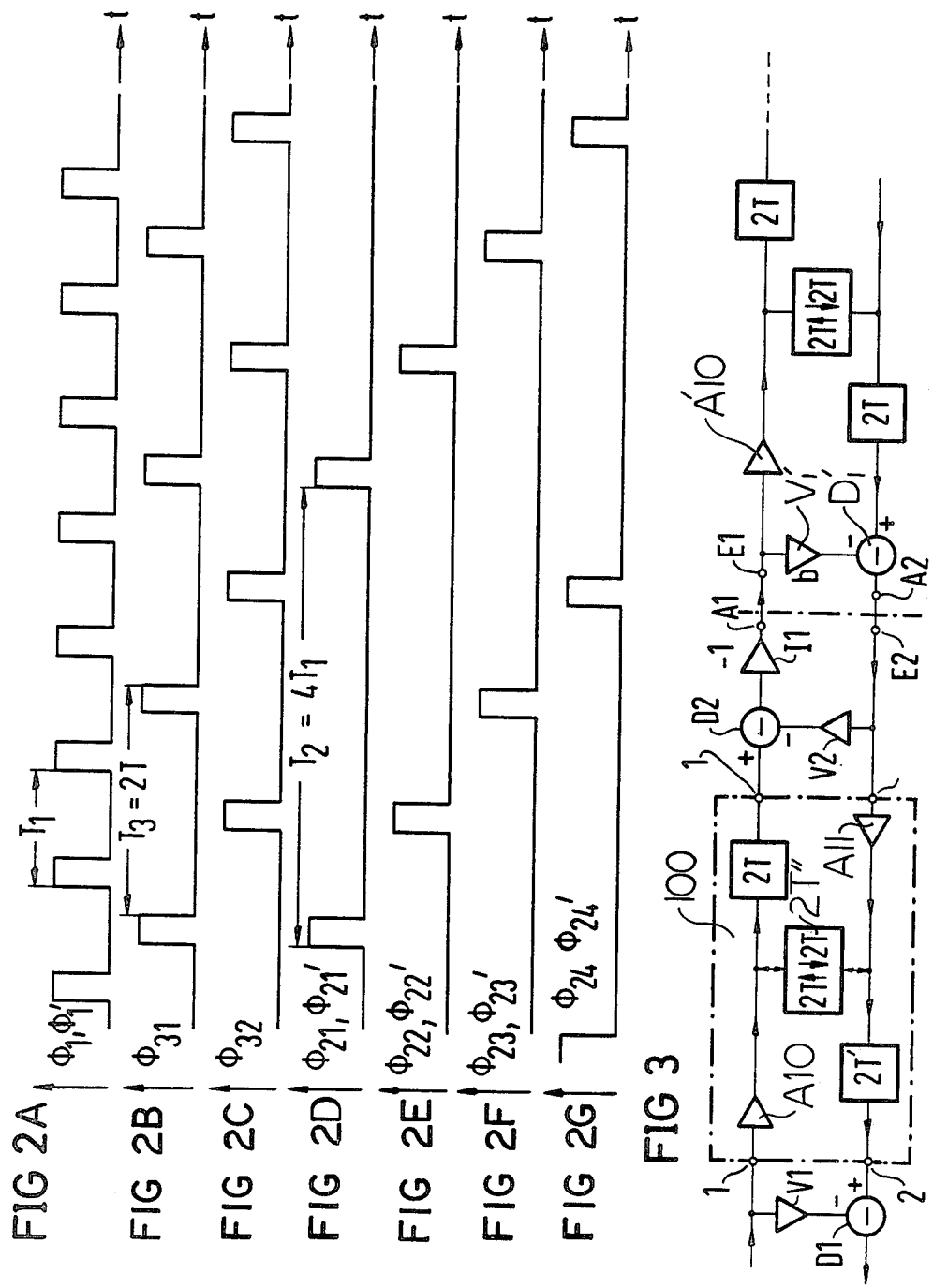

RESONATOR FORMED IN INTEGRATED MOS TECHNOLOGY UTILIZING SWITCHED CAPACITORS

BACKGROUND OF THE INVENTION

1. Field of the Invention

This invention relates in general to resonators in MOS technology constructed by means of switched capacitors with at least one accumulator stage having a line at a reference potential and a continuous signal series arm from the accumulator input to the accumulator output, in which the signal series arm has a series switch which is connected to the accumulator input and in the accumulator shunt arm a first capacitor is connected to a reference potential, and at least one series connection is parallel to the first capacitor and comprises a cross switch and a further capacitor which goes to reference potential.

2. Description of the Prior Art

Resonator circuits in MOS technology for scanned analog signals are known as, for example, from the article "Analog Simple Data Filters" by David L. Fried (IEEE Journal of Solid-State Circuits), pages 302 through 304, August, 1972. In the circuits described in this article, the information processing is accomplished by the use of capacitors which are charged and connected with one another through clock pulse transistors in the manner of a recursive accumulator circuit. An accumulator stage is illustrated in FIG. 1 on page 303 of the above described article. The input voltage is impressed on the capacitor C1 by way of a switch at the input side, whereas the further switch is opened. The charge equalization between capacitors C1 and C2 occurs after the opening of the input side switch and the closing of the further switch.

In FIG. 3 of the above article, the diagram of a MOSP resonator with an accumulator stage consisting of four accumulators is described. In this arrangement, the four accumulators are successively connected to the capacitor C1 which corresponds to four scanning values per signal period upon resonance.

Such circuits are distinguished by means of the relatively simple realization in single layer MOS technology and by the simplicity of the clock pulse pattern functioning without overlapping.

SUMMARY OF THE INVENTION

The present invention relates to a circuit of the type initially described, wherein a representation of general ladder networks or branching circuits is utilized for filters in a single layer MOS technology.

Proceeding from a circuit of this type, the object of the invention is achieved in that the connection point of the cross switches facing the additional capacitors are connected respectively to a further switch with a further continuous signal series arm which is connected, on the one hand, by way of a third capacitor with a reference potential, and on the other hand, by way of a series switch with a further accumulator input. Both signal series arms are connected with the output, or respectively, with a further output of the accumulator arrangement through a respective transit time element consisting of further series switches and additional capacitors. A first input of the resonator arrangement is formed by means of the accumulator input and a first difference element is provided which provides a second output of the resonator arrangement, and which has its first input connected with the further accumulator output, and whose second input is connected with the first input of the resonator arrangement through a first transfer element. In addition, a second input of the resonator arrangement is formed by means of the further accumulator input, and a second difference element is provided which has an output connected to the second output of the resonator arrangement through an inverter element which has a first input that is connected to the accumulator output and has a second input which is connected with the second input of the resonator arrangement through a second transfer element.

It is advantageous that a transmission and a reflection output are associated with each input by means of the inventive circuit. In the resonant case, a nearly unattenuated signal transit with minimum reflection occurs in a very advantageous manner, whereas upon anti-resonance, a strong signal attenuation occurs in the transit direction, which corresponds to a complete reflection of the energy fed in on the input side.

Further objects, features and advantages of the invention will be readily apparent from the following description of certain preferred embodiments thereof, taken in conjunction with the accompanying drawings, although variations and modifications may be effected without departing from the spirit and scope of the novel concepts of the disclosure, and which:

BRIEF DESCRIPTION OF THE DRAWINGS

FIG. 2A through FIG. 2G illustrate various pulse signals occurring in the invention plotted against time;

FIG. 3 illustrates the equivalent circuit for the arrangement shown in FIG. 1, and its iterative network;

DESCRIPTION OF THE PREFERRED EMBODIMENTS

Figure 1:
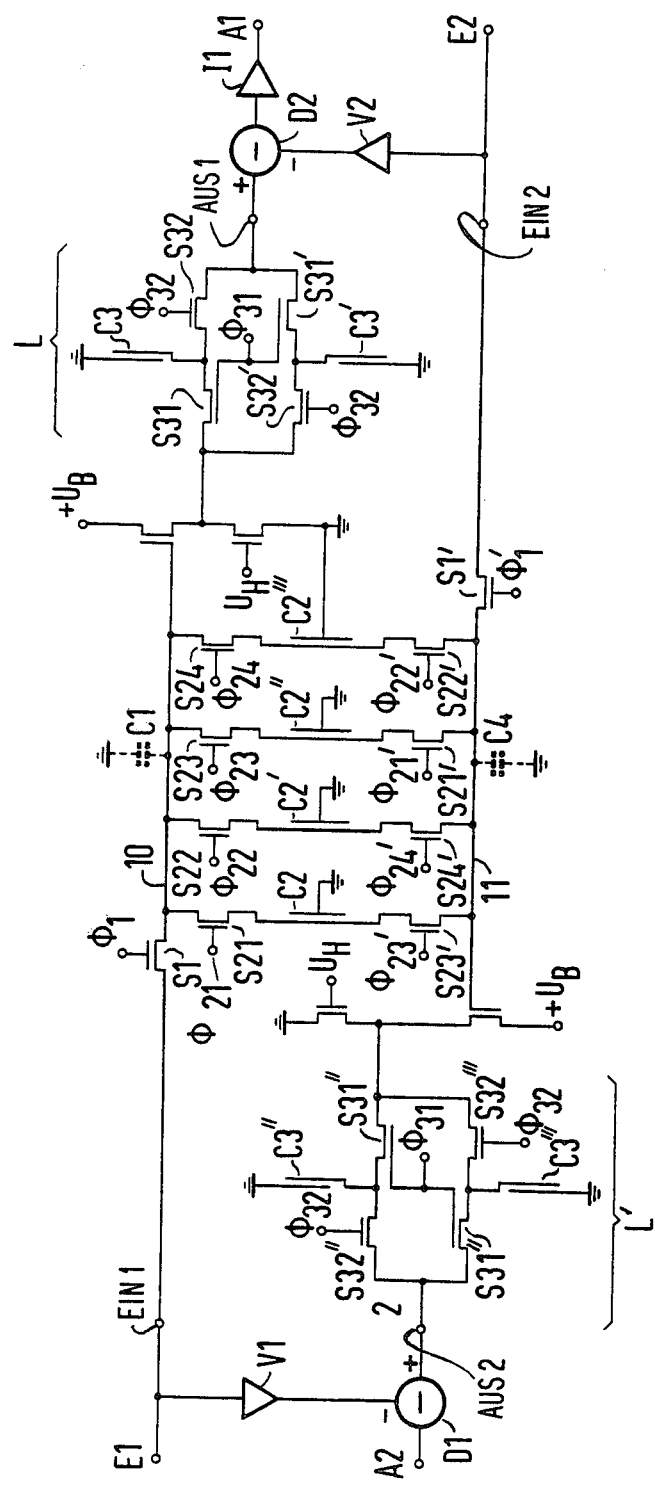
FIG. 1 is a schematic diagram illustrating the invention which has two inputs and two outputs.

FIG. 1 illustrates the circuit of the invention formed in MOS technology, which contains a four-place accumulator stage consisting of a signal series branch indicated by the lead 10 connected to the accumulator input terminals EIN1 through a series switch S1. The signal series conductor 10 is connected to a reference potential such as ground through a first capacitor C1 and the shunt branch of the accumulator consists of eight switches S21 through S24 and S21' through S24', with two of the switches respectively connected in series between conductors 10 and 11 as shown. For example, switch S21 is connected in series with switch S23' between leads 10 and 11. Switch S22 is connected in series with switch S24' between leads 10 and 11. Switch S23 is connected in series with switch S21' between leads 10 and 11. And switch S24 is connected in series with switch S22' between leads 10 and 11. Capacitors C2 C2', C2" and C2''' are connected to ground between the midpoints between the respective series switches, as shown. A transit time stage L which has an output that is indicated as AUS1 receives the output of the series conductor 10.

The conductor 11 is connected through a capacitor C4 to a reference potential, as for example, ground, and through a series switch S1' to a second accumulator input EIN2.

The second signal series branch 11 is connected to a second accumulator output AUS2 through a transit time element L'. In the sample embodiment, both of the transit time elements are constructed identical to each other. Transit time element L, for example, contains a pair of capacitors C3 and C3', which have first sides connected to reference or ground potential. The other side of the capacitor C3 is connected to the accumulator output AUS1 through a switch S32. The second side of the capacitor C3 is also connected through the signal series switch S31 which connects it to the accumulator output on lead 10.

Switches S32' and S31' are connected in parallel with switches S31 and S32 and capacitor C3' is connected between the junction point between the switches S32' and S31' to ground, as shown.

The capacitor C3'' has one side connected to the ground and the other side connected to lead 11 through the switch S31''. A switch S32'' connects the other side of capacitor C3'' to the output terminal AUS2. Switches S31''' and S32''' are connected in parallel with the switches S32' and S31''. A capacitor C3''' is connected between ground and the junction point between the switches S31''' and S32''', as shown.

The capacitors C1 or C4 shown in broken lines can be formed in MOS technique as the gate capacitance of the source-follower and the diffusion areas of the switching transistors. The capacitors C2 are connected to the drain areas of the cross-switches S21 through S24 and S21' through S24' and are formed as switching transistors, and consist of an oxide capacitance and a capacitance of the diffusion area.

So as to complete the accumulator structure having the four connections comprising two inputs and two outputs, respectively numbered as EIN1, AUS1, EIN2 and AUS2 and representing a resonator with two inputs and two outputs to form a four-pole resonator, a first transfer element V1 has one side connected between terminal E1 and EIN1 and the other side connected to a difference or subtracting element D1, which is connected between terminals A2 and AUS2, as shown. The terminals E1 and A2 represent the first input and the second output of the four-pole resonator.

A second difference element D2 is connected between terminal AUS1 and an inverter I1, which has its other side connected to output terminal A1. A second transfer element V2 is connected to the difference element D2 and has its other side connected to a lead which is connected between terminals EIN2 and second input terminal E2.

The elements D1, D2, V1, V2 and I1 of the coupling circuits between the connections of the accumulator arrangement and the connections of the four-pole resonator arrangement consist of unpulsed inverters and difference stages of relatively low gain. This allows a high limiting frequency to be utilized on one hand, and it also guarantees that a frequency independent phase angle rotation of 180° occurs in the coupling circuit when series connection of a plurality of such four-pole resonator arrangements is made. Thus, these four-pole resonators can be suitably utilized as low-pass filters.

The pulse signal arrangements for the various transistor switches are illustrated in FIGS. 2A through 2G. In FIG. 2A the wave form $\phi 1$ illustrates the pulse form for driving the switch S1. The wave form $\phi 1'$ represents the pulse for driving switch S1'. FIG. 2B illustrates the wave form $\phi 31$, which is applied to switches S31, S31', S31'', and S31'''. FIG. 2C illustrates the wave form $\phi 32$, which is connected to control switches S32, S32', S32'', and S32'''. FIG. 2D illustrates the wave form for the pulses $\phi 21$ and $\phi 21'$ which control the switches S21 and S21'. FIG. 2E illustrates the pulses $\phi 22$ and $\phi 22'$ which respectively control the switches S22 and S22'. FIG. 2F illustrates the form of the pulses $\phi 23$ and $\phi 23'$ which respectively control the switches S23 and S23'. FIG. 2G illustrates the form of the pulses $\phi 24$ and $\phi 24'$ which respectively control the switches S24 and S24'. The period of the pulses $\phi 1$ and $\phi 1'$ is equal to T1, as illustrated in FIG. 2A. The signal $\phi 31$ has a period of T3=2T1, and is displaced by 180° when the switches S31 and S32 are alternately opened and closed, and are switched in the gaps when the switches S1 and S1' are not closed, as illustrated in FIGS. 2A and 2B. The pulse period $T_2$ of the switches S21, S21' through S24, S24' is equal to 4T1 as illustrated in FIGS. 2D through 2G, and the signals are displaced relative to one another by the period duration of T1 and fall in the switching gaps of the switches S1 and S1'.

FIG. 3 is a diagram for coupling two four-pole resonators connected in series which respectively include four place accumulator stages as shown in FIG. 1. The equivalent circuit for the accumulator arrangement includes an input side amplification element and an output side transit time element 2T, connected between the first accumulator input EIN1 and the first accumulator output AUS1. The connection leading from the second input EIN2 to the second output AUS2 also includes an amplification element A11 and a transit time element 2T'. The amplification element in the path between terminal EIN1 and AUS1 is designated as A10. A further transit time element 2T'' is connected as shown in FIG. 3, and has a time delay of 2T, and is arranged in the shunt arm between the amplifiers and transit time elements A10, 2T and 2T' and A11.

The following relationships exist for the arrangements according to FIGS. 1, 2 and 3. The general transfer function of an accumulator has the following form.

$$\frac{U_{AUS}}{U_{EIN}} = \frac{1-k}{1-kz^{-1}} \text{ with } k = \frac{C_2}{C_1+C_2}$$

$$\text{and } z^{-1} = e^{-j\omega T}$$

From this, there ensues the transfer function for the resonator with two inputs and two outputs $$\frac{U_{A1}}{U_{E1}} = z^{-2}\frac{1-k}{1-k^2a^{-4}} = \frac{U_{A2}}{U_{E2}}$$

$$\frac{U_{A2}}{U_{E2}} = k \cdot z^{-4}\frac{1-k}{1-k^2z^{-4}} = \frac{U_{A1}}{U_{E2}}$$

and the relative quality $$B_{rel} = \frac{1}{\pi} \text{ arc cos. } \left(\frac{4k^2-k^4-1}{2k^2}\right) \approx \frac{1-k^2}{\pi \cdot k}$$

The following relationship ensues for the amplification $$a \cdot c \frac{1}{1+k} = 1 \; ; a = (1+k)b.$$

whereby a represents the amplification factor of the amplification elements A10 and A11, b represents the amplification factor of the transfer elements V1 or V2 and c represents the amplification factor of the difference elements D1 and D2.

Figure 4:
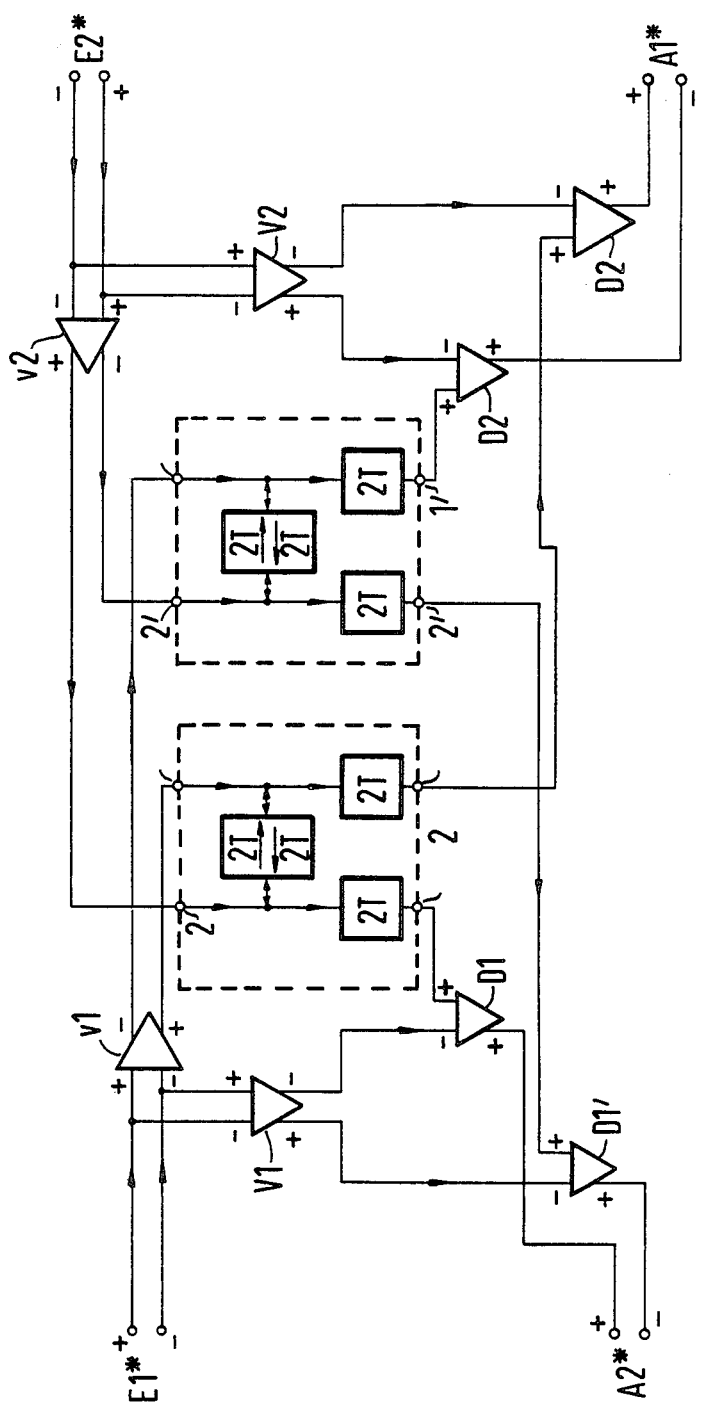
FIG. 4 is a circuit diagram for an arrangement utilizing push-pull circuits and the circuits of FIG. 1.

FIG. 4 illustrates a basic circuit of a further development of the arrangement according to FIG. 1, in which by utilizing the push-pull principle an increase of the dynamic range, as well as of a particularly strong suppression of the pick-up of the harmonic distortion of the second order results.

A pair of inputs E1* and E2* and a pair of outputs A1* and A2* of the four-pole resonator in the push-pull according to FIG. 4, respectively contain a connection designated as plus (+) and negative (−). The heart of the arrangement is formed by means of two identically constructed accumulator circuits which essentially are the same as the corresponding arrangement shown in FIG. 3 which have the connection points EIN1, EIN2, AUS1 and AUS2 and EIN1', EIN2', AUS1' and AUS2'. The amplifiers which are arranged within the accumulator arrangement, as shown in the signal series branches in FIG. 3 are incorporated into the external wiring of the accumulator arrangements in the push-pull arrangement, according to FIG. 4, so as to reduce the circuit outlay.

The two connections of the first input E1* of the push-pull arrangement shown in FIG. 4 are connected with the first inputs EIN1 and EIN1' of the accumulator arrangements through an amplifier v1 which has two inputs and two outputs. These are respectively designated as positive (+) and negative (−) and the positive arrangements are always supplied to one accumulator arrangement, as for example, the accumulator arrangement on the left portion of FIG. 4 and the negative output of the amplifier v1 are allocated to the accumulator on the right side of FIG. 4. In an analogous manner, the two inputs E2* are supplied to an amplifier v2 which has both plus and minus outputs and the plus output is supplied to the accumulator input terminal EIN2 for the accumulator on the left of FIG. 4, and the negative output of amplifier v2 is connected to the terminal EIN2' of the second accumulator shown on the right of FIG. 4.

Thus, the amplifier v1 and v2 correspond to the amplifiers in the series branch in the accumulator arrangement according to FIG. 3.

In FIG. 4, an additional amplifier V1 having two inputs and two outputs which functionally correspond to the elements V1 illustrated in FIG. 3, is connected with its input side with the connections of the first input E1* of the push-pull circuit and supplies its negative output to the input reference negative of a difference element D1, which receives a second input referenced positive that is connected to a second output AUS2 of the accumulator illustrated on the left of FIG. 4. The output of the difference element D1, which is indicated positive is connected to the positive terminal of the second output A2* of the push-pull circuit.

The second output referenced positive of the amplification element V1 is connected to the negative input of an additional difference element D1', which receives a positive input from terminal AUS2' of the second accumulator shown on the right of FIG. 4. The output of the difference element D1' is supplied to the negative terminal of A2* of the push-pull circuit.

A second amplification element V2 has two inputs and two outputs which are respectively connected to the positive and negative terminals of the input E2*. The negative output of amplifier V2 is supplied to the negative terminal of the difference element D2, which receives on its positive input terminal, the output from the resonator on the left of FIG. 4 at terminal AUS1. A third difference element D2' receives on its negative input terminal the positive output of the amplifier V2 an output from terminal AUS1' on its positive input. This difference element D2' supplies a positive output to the negative terminal of terminal A1* as shown.

In single clock pulse operation, the clock pulse pickup at the resonant frequency will lie at an approximately 60 dB interval relative to the signal and can be increased to more than 70 dB interval by means of the push-pull circuit. The push-pull circuit illustrated in FIG. 4 is also of advantage because of the suppression of harmonics and also, there results a higher stability because of reduction of drift influences. Single stage difference elements with post-connected emitter-followers are advantageous when employed as switching elements.

Figure 5:
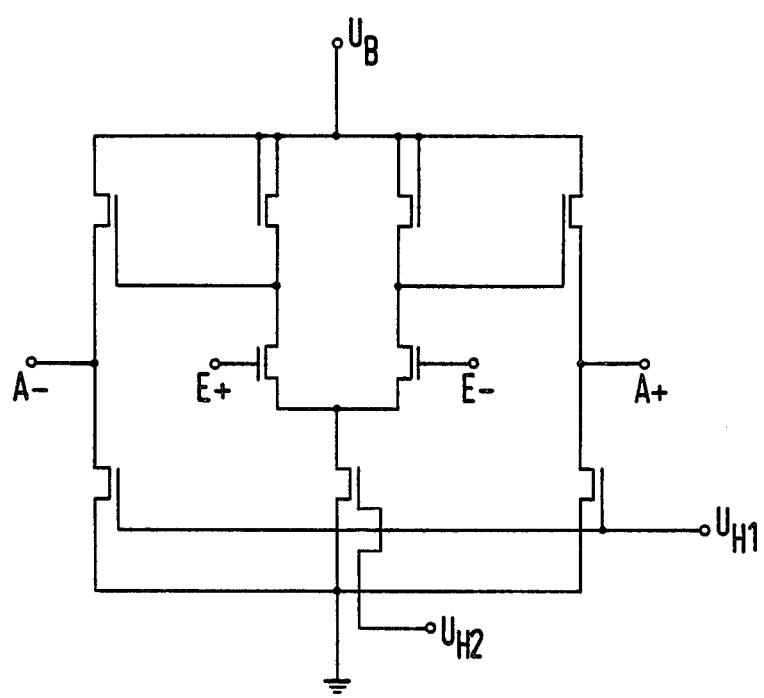
FIG. 5 is a schematic diagram of a difference stage utilizing emitter-followers.

FIG. 5 illustrates an electrical schematic of a difference stage formed of an emitter-follower which can be designed for use, for example, in the arrangement illustrated in FIG. 4. The difference stage is constructed in MOS technology and contains a differential amplifier which is connected to load resistors constructed in MOS technology, and the inputs are referenced by terminals E+ and E−, and the outputs are referenced with A+ and A−. Operating voltage is supplied at terminal marked $U_B$, and constant auxiliary voltages are applied at terminals marked $U_{H1}$ and $U_{H2}$. The various transistors are connected as shown in FIG. 5.

Although the invention has been described with respect to preferred embodiments, it is not to be so limited as changes, modifications may be made therein, which are within the full intended scope as defined by the appended claims.

We claim as our invention:

1. A resonator formed in integrated MOS technology using switched capacitors with at least one accumulator stage which has a conductor at reference potential and a continuous signal series conductor extending from the accumulator input to the accumulator output, in which a series switch is connected in series with the accumulator input and a first capacitor connected from a shunt branch to a reference potential and at least one series circuit connected in parallel with said first capacitor consisting of a cross switch and a second plurality of capacitors connected to said reference potential, characterized in that the connection points of the cross switches adjacent said second plurality of capacitors are respectively connected by way of further switches with an additional continuous signal series conductor which is connected on the one hand by way of a third capacitor with said reference potential, and on the other hand, by way of a second series switch with a second accumulator input; and both signal series conductors are connected by way of respective transit time elements consisting of series switches and additional capacitors with the output or, respectively, with a further output of the accumulator arrangement; and in that a first input of the resonator arrangement is formed by means of the accumulator input; and a first difference element is connected to a second output of said resonator, and has a first input connected to a further accumulator output and a second input connected by way of a first transfer element with the first input of the resonator arrangement; a second input of the resonator arrangement is formed by means of the further accumulator input; and a second difference element is provided whose output is connected through an inverter element with a first output of the resonator arrangement, and has a first input connected with the accumulator output, and a second input connected by way of a second transfer element with the second input of the resonator arrangement.

2. A resonator formed in integrated MOS technology using switched capacitors according to claim 1, characterized in that it is formed as push-pull arrangement.

3. A resonator formed in integrated MOS technology comprising, first and second input terminals and first and second output terminals, a first series branch including a first series switch, a first transfer time element, a first difference element, and an inverter connected in series between the first input terminal and the first output terminal, a second series branch including a second difference element, a second series switch connected in series between said second output terminal and said second input terminal, a plurality of shunt branches extending between said first and second series branches and each consisting of two series connected switches, and a first plurality of capacitors connected between reference potential and the junction points between said respective series connected switches, and switching potentials connected to said first and second series switches and to said series connected switches.

4. A resonator according to claim 3, including a second capacitor connected between said first series branch and reference potential.

5. A resonator according to claim 4, including a third capacitor connected between said second series branch and reference potential.

6. A resonator according to claim 5, wherein said first transit time element comprises third and fourth switches in series and fifth and sixth switches in series and the combination connected in parallel with said third and fourth switches, a fourth capacitor connected between said third and fourth switches and reference potential, a fifth capacitor connected between said fifth and sixth switches and reference potential, and switching potentials connected to said third, fourth, fifth and sixth switches to open and close them.

* * * * *